(12) United States Patent
Chiu

(10) Patent No.: US 7,139,536 B2
(45) Date of Patent: Nov. 21, 2006

(54) METHOD AND APPARATUS FOR I/Q IMBALANCE CALIBRATION OF A TRANSMITTER SYSTEM

(75) Inventor: Mao-Ching Chiu, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 593 days.

(21) Appl. No.: 10/725,654

(22) Filed: Dec. 2, 2003

(65) Prior Publication Data

US 2005/0118963 A1  Jun. 2, 2005

(51) Int. Cl.
*H04B 11/00* (2006.01)

(52) U.S. Cl. .............. 455/115.1; 455/115.2; 455/67.11; 455/24; 455/108; 375/324; 375/355; 375/232

(58) Field of Classification Search ........... 455/115.1, 455/115.2, 67.11, 24, 108; 375/324, 355, 375/232
See application file for complete search history.

(56) References Cited

U.S. PATENT DOCUMENTS

2003/0228017 A1* 12/2003 Beadle et al. ............... 380/270
2004/0207422 A1* 10/2004 Lehtinen et al. ............ 324/758
2006/0133548 A1*  6/2006 Oh et al. .................... 375/346

* cited by examiner

Primary Examiner—Matthew Anderson
Assistant Examiner—Minh Dao
(74) Attorney, Agent, or Firm—Thomas, Kayden, Horstemeyer & Risley

(57) ABSTRACT

A method for I/Q imbalance calibration of an OFDM system comprising the steps of initializing parameters $A_p$, $B_p$ and $\gamma_p$, estimating a loop delay factor L, generating a discrete-time test signal x[n], deriving a signal $x_{com}[n]$ by compensating the test signal x[n] according to a function with parameters $A_p$, $B_p$ and $\gamma_p$, converting the signal $x_{com}[n]$ to an analog signal x(t), applying I/Q modulation to the signal x(t) and outputting a modulated signal $x_{mod}(t)$, obtaining a characteristic signal $x_c(t)$ of the modulated signal, obtaining a signal $x_s[n]$ by sampling the characteristic signal $x_c(t)$ and obtaining statistics $U_1$ and $U_2$ of the signal $x_s[n]$, and updating the parameters $A_p$, $B_p$ and $\gamma_p$ respectively by functions of L, $U_1$, $U_2$, and the current values of $A_p$, $B_p$ and $\gamma_p$.

18 Claims, 5 Drawing Sheets

METHOD AND APPARATUS FOR I/Q IMBALANCE CALIBRATION OF A TRANSMITTER SYSTEM

BACKGROUND OF THE INVENTION

1. Field of the Invention

The present invention relates to compensation of physical layer impairments on transmitter systems and particularly to a method and apparatus for I/Q imbalance calibration in transmitter systems.

2. Description of the Prior Art

OFDM is a multi-channel modulation system employing Frequency Division Multiplexing (FDM) of orthogonal sub-carriers, each modulating a low bit-rate digital stream. The simplest way to describe an orthogonal frequency-division multiplexing (OFDM) signal is as a set of closely spaced frequency-division multiplexed carriers. While this is a good starting point for those unfamiliar with the technology, it falls short as a model for analyzing the effects of signal impairment.

The reason it falls short is that the carriers are more than closely spaced; they are heavily overlapped. In a perfect OFDM signal, the orthogonality property prevents interference between overlapping carriers. This is different from the FDM systems. In FDM systems, any overlap in the spectrums of adjacent signals will result in interference. In OFDM systems, the carriers will interfere with each other only if there is a loss of orthogonality. So long as orthogonality can be maintained, the carriers can be heavily overlapped, allowing increased spectral efficiency.

Table 1 lists a variety of common analog signal impairments and their effects on both OFDM signals and the more familiar single-carrier modulations such as quadrature phase-shift keying (QPSK) or 64-QAM (quadrature amplitude modulation). Most of these impairments can occur in either the transmitter or the receiver.

| Impairment | OFDM | QPSK |
|---|---|---|
| I/Q gain balance | State spreading (uniform/carrier) | Distortion of constellation |
| I/Q quadrature skew | State spreading (uniform/carrier) | Distortion of constellation |
| I/Q channel mismatch | State spreading (non-uniform/carrier) | State spreading |
| Uncompensated frequency error | State spreading | Spinning constellation |
| Phase noise | State spreading (uniform/carrier) | Constellation phase arcing |
| Nonlinear distortion | State spreading | State spreading |
| Linear distortion | Usually no effect (equalized) | State spreading if not equalized |
| Carrier leakage | Offset constellation for center carrier only (if used) | Offset constellation |
| Frequency error | State spreading | Constellation phase arcing |
| Amplifier droop | Radial constellation distortion | Radial constellation distortion |
| Spurious | State spreading or shifting of affected sub-carrier | State spreading, generally circular |

IQ Imperfections

For cost reasons, analog in-phase and quadrature (I/Q) modulators and demodulators are often used in transceivers—especially for wide bandwidth signals. Being analog, these I/Q modulators and demodulators usually have imperfections that result in an imperfect match between the two baseband analog signals, I and Q, which represent the complex carrier. For example, gain mismatch might cause the I signal to be slightly smaller than the Q. In a single-carrier modulation system, this results in a visible distortion in the constellation—the square constellation of a 64-QAM signal would become rectangular.

To better understand how gain imbalance will affect an OFDM signal, look at the equations describing each individual sub-carrier. In the following analysis, it's important to keep in mind that, while an individual sub-carrier is analyzed, the IQ gain imbalance error is on the signal that is the composite of all sub-carriers.

In the equation (1), $C_{k,m}$ is a complex number representing the location of the symbol within the constellation for the Kth sub-carrier at the mth symbol time. For example, if sub-carrier k is binary-phase-shift-keying (BPSK) modulated, then $C_{k,m}$ might take on values of $\pm 1 + j0$. The complex exponential portion of Equation 1 represents the Kth sub-carrier, which is amplitude- and phase-modulated by the symbol $C_{k,m}$. Therefore:

$$C_{k,m}(e^{j2\pi k \Delta ft}) \quad (1)$$

Using Euler's relation, the equation (1) can be rewritten as:

$$C_{k,m}(\cos(2\pi \cdot k\Delta ft) + j\sin(2\pi \cdot k\Delta ft)) \quad (2)$$

Now add the term "β" to represent gain imbalance. For a perfect signal, set β=0. As shown, the gain imbalance term will also produce a gain change. This was done to simplify the analysis. Therefore:

$$C_{k,m}((1+\beta)\cos(2\pi \cdot k\Delta ft) + j\sin(2\pi \cdot k\Delta ft)) \quad (3)$$

The equation can be rearranged and this can be rewritten as the sum of a perfect signal and an error signal:

$$C_{k,m}(\cos(2\pi \cdot k\Delta ft) + j\sin(2\pi \cdot k\Delta ft)) + C_{k,m}\beta\cos(2\pi \cdot k\Delta ft) \quad (4)$$

Finally, converting back into complex exponential notation, we get:

$$C_{k,m}e^{j2\pi k\Delta ft} + \left(C_{k,m}\frac{\beta}{2}\right) \cdot (e^{j2\pi k\Delta ft} + e^{-j2\pi k\Delta ft}) \quad (5)$$

In words, the equation (5) shows that a gain imbalance produces two error terms. The first error term is at the frequency of the Kth sub-carrier. The second error term is at the frequency of the −Kth sub-carrier. The phase and magnitude of the error terms are proportional to the symbol being transmitted on the Kth sub-carrier. Another way of saying this is that I/Q gain imbalance will result in each sub-carrier being interfered with by its frequency mirror-image sub-carrier. Persons skilled in the art will instantly recognize this as imperfect sideband cancellation.

The equation (5) has several implications. First, it is generally true that for sub-carriers used to carry data (as opposed to pilots), the symbol being transmitted at any given time on the Kth sub-carrier is uncorrelated to the symbol on the −Kth sub-carrier.

For a given sub-carrier, the lack of correlation from the mirror-image sub-carrier implies a certain randomness to the error. This results in a spreading of the sub-carrier's constellation states in a noise-like fashion. This is especially true for higher-order modulations such as 64-QAM. For lower-order modulations, such as BPSK, the error term from the mirror-image carrier has fewer states.

This can result in constellations where the BPSK pilot carriers of an 802.11a signal exhibit spreading that does not appear noise-like. Also, as the BPSK pilots do not have an imaginary component; the error terms associated with the pilot sub-carriers are real—so the spreading is only along the real (I) axis. Note that the phase relationships between the pilot carriers in an 802.11a system are highly correlated, so the errors introduced by quadrature errors are not random.

Quadrature skew produces error terms similar to those produced by gain imbalance. Quadrature skew occurs when the two oscillators used in an I/Q modulator or demodulator do not differ by exactly 90°. For a small angular error, it can be shown that the resulting error is orthogonal to the data. This is indicated by the j in front of the error terms in the equation (6). As with gain imbalance, the error generates energy at the Kth and –Kth sub-carriers. Again, the 802.11a BPSK pilots do not have an imaginary component, so the error term, which is now orthogonal, causes spreading along the Q axis. For the QPSK carriers in this example, the error is also orthogonal. However, unlike BPSK, a QPSK constellation doesn't look any different when rotated by 90°. (See the equation (6).):

$$C_{k,m}e^{j2\pi k\Delta ft} + j\frac{C_{k,m}\phi}{2} \cdot (e^{j2\pi k\Delta ft} + e^{-j2\pi k\Delta ft}) \qquad (6)$$

In both 802.11a and Hiperlan2, a channel estimation sequence is transmitted at the beginning of a burst. This special sequence is used to train the receiver's equalizer. The intended function of the equalizer is to compensate the received signal for multi-path distortion—a linear impairment in the signal that is the result of multiple signal paths between the transmitter and the receiver. As the ideal channel estimation sequence is known by the receiver, the receiver can observe the effects of the channel on the transmitted signal and compute a set of equalizer coefficients.

In the transmitter, the channel estimation sequence is created by BPSK modulating all 52 carriers for a portion of the preamble. Not coincidentally, the equalizer consists of 52 complex coefficients—one for each sub-carrier. It should come as no surprise that each sub-carrier in the channel estimation sequence has the greatest influence on the equalizer coefficient computed for that same sub-carrier.

The channel estimation sequence, and the receiver algorithms that compute the equalizer coefficients, are not immune from signal impairments. Consider, for example, the effect of I/Q gain imbalance on sub-carriers +26 and –26 of the channel estimation sequence. Recall from Equation 5 that each sub-carrier has two error terms: one at the same frequency as the sub-carrier, and one at the mirror image frequency. The I/Q gain imbalance will cause mutual interference between sub-carriers +26 and –26.

From the IEEE 802.11a standard, the sub-carrier modulation for the channel estimation sequence is defined to be $C_{-26}=1+j0$ and $C_{+26}=1+j0$. Using these values in Equation 5, one can easily determine that the two sub-carriers, when combined with the resulting error terms, will suffer an increase in amplitude. The equalizer algorithm will be unable to differentiate the error from the actual channel response, and will interpret this as a channel with too much gain at these two sub-carrier frequencies. The equalizer will incorrectly attempt to compensate by reducing the gain on these sub-carriers for subsequent data symbols.

The result will be different for other sub-carrier pairs, depending on the BPSK channel estimation symbols assigned to each.

With QPSK sub-carriers, the equalizer error caused by gain imbalance, or quadrature skew, results in seven groupings in each corner. Each QPSK sub-carrier suffers from QPSK interference from its mirror image. This results in a spreading to four constellation points in each corner. Each QPSK sub-carrier also suffers from a bi-level gain error introduced by the equalizer. This would produce eight groupings, except that the gain error is such that corners of the groupings overlap at the ideal corner state. Only seven groupings are visible.

IQ Channel Mismatch

When the frequency response of the baseband I and Q channel signal paths are different, an I/Q channel mismatch exists. I/Q channel mismatch can be modeled as a sub-carrier-dependent gain imbalance and quadrature skew. I/Q gain imbalance and quadrature skew, as described above, are simply a degenerate form of I/Q channel mismatch in which the mismatch is constant over all sub-carriers. Think of channel mismatch as gain imbalance and quadrature skew as a function of a sub-carrier. It is still generally true that channel mismatch causes interaction between the Kth and –Kth sub-carriers, but that the magnitude of the impairment could differ between the Kth and the (k+n)th carriers.

Delay mismatch is a distinct error. It can occur when the signal path for the I signal differs in electrical length from the Q signal. This can be caused by different cable lengths (or traces), timing skew between D/A converters used to generate the I and Q signals, or group delay differences in filters in the I and Q signal paths.

What makes this error distinctive is that the error is greater for the outer carriers than it is for the inner carriers. In other words, the error increases with distance from the center sub-carrier. With a vector spectrum display, it may be shown that the signal error is a function of the sub-carrier number (frequency). That is to say, the phase arcing may occur as a function of frequency.

Phase Noise

Phase noise results in each sub-carrier interfering with several other sub-carriers—especially those in close proximity. Close-in phase noise that results in the constellation rotation for the data carriers also results in rotation of the pilot carriers. In fact, carrier phase error rotates all sub-carriers by the same amount, regardless of the sub-carrier frequency. Phase-tracking algorithms use the pilot symbols to detect this common rotation and compensate all of the carriers accordingly. This error is often referred to as common pilot, or common phase error (CPE). Phase noise that is not considered to be close-in results in inter-carrier interference. Instead of constellations with visible rotation, phase noise in an OFDM signal generally results in fuzzy constellation displays, similar to what would be expected if noise is added to the signal.

In 802.11a, the symbol rate is 250 kHz. As pilot symbols are present in every OFDM symbol interval, one might think of this as the sample rate at which the phase-tracking algorithms are operating. Sampling theory would suggest that one will have problems with phase noise beyond one-half the sample rate, or 125 kHz (Nyquist).

Unfortunately, there's another error mechanism that occurs at frequencies much lower than one-half the sample rate. The pilot tracking algorithms are post-fast Fourier transform (FFT). As the FFT is a mapping of the time waveform into the frequency domain (Fourier coefficients), any error that results in energy from one sub-carrier leaking into other sub-carriers cannot be compensated for with a simple post-FFT sub-carrier de-rotation.

Phase noise modulates each of the sub-carriers to the point that they no longer look like simple sinusoids within the FFT interval. Consider an FFT of a single tone. If the tone is pure and has a frequency that produces an integral number of cycles within the FFT time buffer, then an FFT will produce a result with only one non-zero value. If the pure tone is now phase modulated, it can no longer be represented as a single Fourier coefficient—even if the signal is periodic with the FFT time buffer. In other words, the sub-carrier will interfere with the other sub-carriers. If the phase-modulating signal is separated into a DC component plus an AC component, the DC component is corrected by the post-FFT pilot-tracking algorithms.

The impact of random phase noise on the sin(x)/x shape of an individual sub-carrier is a gradual roll-off (an artifact mostly caused by the uniform-windowed FFT used in the receiver). Phase noise causes the nulls of the sin(x)/x spectrum to fill in, creating interference between every sub-carrier and its neighbors.

Frequency Error

In any coherent modulation format, it is critical that the receiver accurately track the transmitter frequency. Frequency is defined to be the derivative of the phase with respect to time, so frequency error can be described as a cumulative phase error that linearly increases or decreases with time, depending on the sign of the frequency error. For single-carrier modulation formats such as 64-QAM, a frequency error can be visualized as a spinning constellation diagram.

The effect of frequency error on OFDM signals is different. Under ideal conditions, each of the sub-carriers in an OFDM signal is periodic within the FFT time buffer. This is critical if the sub-carriers are to remain orthogonal and avoid mutual interference.

A frequency error between the transmitter and the receiver will cause all of the sub-carriers to have a non-integral number of cycles in the FFT time interval, causing leakage. A frequency error shifts the sin(x)/x spectrum of each sub-carrier relative to the FFT frequency bins to the point that the spectral nulls are no longer aligned with the FFT bins. The result is that frequency error causes every sub-carrier to interfere with its neighbors.

Nonlinear Distortion

The effects of nonlinear distortion on an OFDM signal are easily understood by those familiar with inter-modulation distortion. Nonlinear distortion is a particularly important topic for OFDM signals because the signal represents the linear summation of a large number of statistically independent sub-carriers. This results in a signal with Gaussian voltage statistics on the I and Q waveforms.

Sometimes people refer to the signal as having Gaussian statistics in the context of peak-to-average power. This can be misleading because the power statistics are not Gaussian. The I and Q voltage waveforms are Gaussian, but the power, which is the sum of the squares of the I and Q signals, has a chi-square distribution. All that aside, a perfect OFDM signal can have peak envelope power that exceeds the average envelope power by more than 10 dB. This presents the power amplifier designer with some difficult challenges.

In the context of nonlinear distortion, it's safe to model the OFDM signal as a multi-tone signal with each of the tones having a random phase component. In fact, that's exactly what an OFDM signal is. Multi-tone analysis and testing is probably better suited to OFDM signals than to the multi-carrier signals for which it was originally developed.

For most single-carrier modulation formats (excluding code-division multiple access (CDMA) signals), the Nyquist filters. create peak power excursions that occur between symbols.

Errors due to saturation will cause adjacent channel power problems, but may not have a large impact on data transmission—depending on the amount of dispersion in the transmission channel and the receiver's matched filter. For OFDM, the peak power excursions may occur at any time within the symbol interval. Because the OFDM time waveform is a summation of all sub-carriers, nonlinear distortion will create inter-carrier interference. Of course, it will also result in increased adjacent channel power.

Spurious Signals

When a spurious signal is added to an OFDM signal, the effect is similar to what happens with single-carrier modulations. If the spurious tone is at the exact frequency of a sub-carrier, then the effect is to shift the constellation of that sub-carrier—just as carrier leakage shifts the constellation of a single-carrier modulation. Otherwise, the spurious signal causes a spreading of the constellation points for sub-carriers near the spurious tone. Carrier leakage in an OFDM signal only affects the center carrier (if used).

In order to eliminate the effects of the previously described impairments on the OFDM systems, various kinds of compensation circuit and method have been proposed.

U.S. Application Publication No. 20020015450 discloses a method and an arrangement for determining correction parameters used for correcting phase and amplitude imbalance of an I/Q modulator in a transmitter. The transmitter includes an I/Q modulator and a corrector for correcting the phase and amplitude imbalance caused by the I/Q modulator. The arrangement has means for sampling the I/Q-modulated test signal to be transmitted, means for A/D-converting the signal samples taken from the test signal, means for I/Q-demodulating the signal samples digitally into I- and Q-feedback signals, means for determining the phase and amplitude imbalance caused by the I/Q modulator on the basis of the I- and Q-feedback signals, and means for determining the correction parameters of phase and amplitude on the basis of the determined phase and amplitude imbalance.

U.S. Pat. No. 6,208,698 discloses a quadrature modulator controlled by an imbalance estimator, as shown in FIG. 1. The estimator is entirely analog and includes two mixers 120, 121 to which are applied two carrier signals P1 and P2 derived from a carrier signal P obtained from a local oscillator and from a 90° phase-shifter 122. A modulating signal X, Y is applied to each of the mixers 120, 121. The output signals of the mixers 120, 121 are applied to a combiner 123 to constitute a modulated signal S. The modulated signal S is either an intermediate frequency signal or a microwave frequency signal. The estimator 124 of the invention includes means 125 for detecting the instantaneous power Pd of the modulated signal S, means 126, 127 for multiplying the detected instantaneous power Pd by each of the modulating signals X, Y, means 128A, 129A for rectifying the signals produced, which rectifier means can be diodes, for example, and means 130, 131 for integrating the rectified signals, the integrator means being followed by subtractors 160, 161 supplying respective signals E1 and E2 proportional to the amplitude of the modulator imbalance. The subtractors 160 and 161 receive respective analog reference signals REF1 and REF2, which are usually identical (REF1=REF2), the output signals of the integrator means 130, 131 being subtracted from REF1 and REF2, respectively. For example, REF1 and REF2 are equal to twice the mean amplitude of the modulated signal S. The subtractors 160 and 161 generally need to be used only for the purposes of correcting imbalance. The signals E1 and E2 are respectively applied to the multipliers 150 and 151 on the input side of the mixers 121 and 120, respectively, to correct the offsets introduced by these mixers.

Although there are already many kinds of compensation circuit and method, it is still a goal for researchers around the world to propose newer and better solutions to the I/Q imbalance issue in the OFDM systems.

SUMMARY OF THE INVENTION

The object of the present invention is to provide a new method and apparatus for I/Q imbalance calibration of an OFDM system.

The present invention provides a method for I/Q imbalance calibration of an OFDM system, comprising the steps of initializing parameters $A_p$, $B_p$ and $\gamma_p$, estimating a loop delay factor L, generating a test signal x[n] which is a discrete-time signal, generating a compensated signal $x_{com}$[n] by compensating the test signal x[n] according to a first function with parameters $A_p$, $B_p$ and $\gamma_p$, converting the compensated signal $x_{com}$[n] to an analog signal x(t), applying I/Q modulation to the analog signal x(t) and outputting a modulated signal $x_{mod}$(t), obtaining a characteristic signal $x_c$(t) of the modulated signal $x_{mod}$(t), obtaining a sampled characteristic signal $x_s$[n] by sampling the characteristic signal $x_c$(t) and obtaining statistics $U_1$ and $U_2$ of the sampled characteristic signal $x_s$[n], and updating the parameters $A_p$, $B_p$ and $\gamma_p$ respectively by one of the second functions, the loop delay factor L, the statistics $U_1$ and $U_2$, and the current values of the parameters $A_p$, $B_p$ and $\gamma_p$.

The present invention further provides an apparatus for I/Q imbalance calibration in an OFDM system comprising a discrete-time signal generator generating a first test signal in an estimation phase, and generating a second test signal in a calibration phase which follows the estimation phase, a correction module receiving the test signal from the signal generator, compensating the test signal according to a first function with parameters $A_p$, $B_p$ and $\gamma_p$ to produce a compensated signal, a first and second D/A converters converting the compensated signal to an analog signal, wherein the first D/A converter converts the real part of the compensated signal to the real part of the analog signal, and the second D/A converter converts the imaginary part of the compensated signal to the imaginary part of the analog signal, a modulator applying I/Q modulation to the analog signal, and outputting a modulated signal, a detector obtaining a characteristic signal of the modulated signal, an A/D converter converting the characteristic signal to a sampled characteristic signal, and a processor implementing the steps of initializing the parameters $A_p$, $B_p$ and $\gamma_p$, obtaining a statistic V based on the sampled characteristic signal in the estimation phase, estimating a loop delay factor L based on the statistic V in the estimation phase, obtaining statistics $U_1$ and $U_2$ based on the sampled characteristic signal in the calibration phase, and updating the parameters $A_p$, $B_p$ and $\gamma_p$ based on the loop delay factor L, the statistics $U_1$ and $U_2$, and the current values of the parameters $A_p$, $B_p$ and $\gamma_p$ in the calibration phase.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
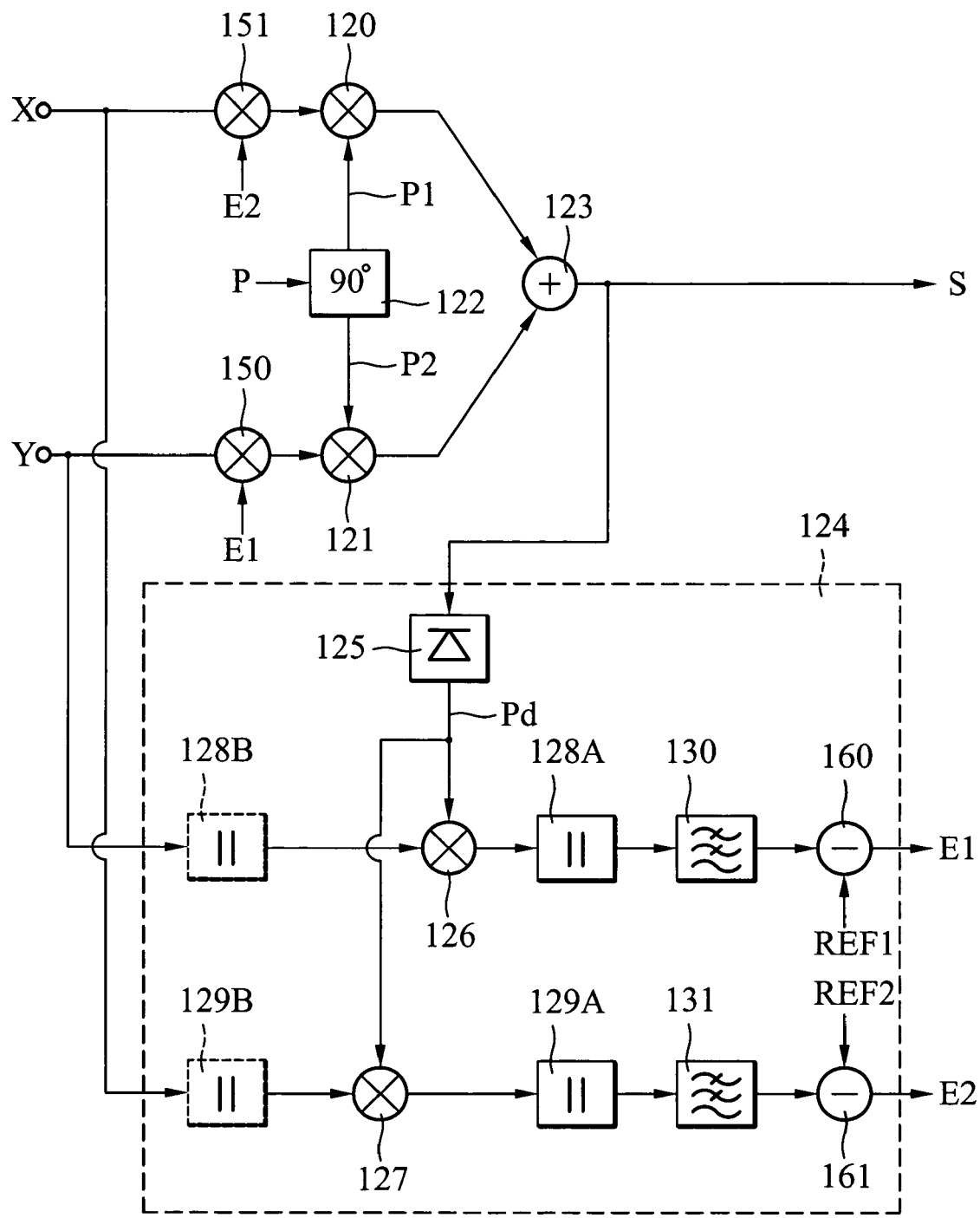
FIG. 1 shows a quadrature modulator controlled by an imbalance estimator as disclosed in U.S. Pat. No. 6,208,698.

In the I/Q channel transmission architecture, there are two major sources of I/Q imbalance. One is the I/Q modulation and the other is the I/Q transmission band filtering. The mismatch resulting from the I/Q modulation is modeled as a constant over the useful signal bandwidth, which is called systematic I/Q imbalance while the I/Q transmission band filtering causes frequency-dependent I/Q imbalance. The present invention concentrates on the systematic I/Q imbalance. The mathematical theories of the invention will be described in the following.

The baseband signals for the I and Q channels before the I/Q modulation are represented as $x_I(t)$ and $x_Q(t)$ respectively. Assuming that an amplitude mismatch $\alpha$, a phase mismatch $\theta$, and zero local leakage results from the I/Q modulation, the equivalent baseband signals $y_I(t)$ and $y_Q(t)$ for the I and Q channels after the I/Q modulation are, without loss of generality, given by the equations:

$$y_I(t)=x_I(t)\cdot(1+\alpha)\cdot\cos(\theta/2)+x_Q(t)\cdot(1-\alpha)\cdot\sin(\theta/2)$$

$$y_Q(t)=x_I(t)\cdot(1+\alpha)\cdot\sin(\theta/2)+x_Q(t)\cdot(1-\alpha)\cdot\cos(\theta/2) \quad (7)$$

The combined baseband signal x(t) before the I/Q modulation can be expressed as $x_I(t)+jx_Q(t)$ while the combined equivalent baseband signal y(t) after the I/Q modulation can be expressed as $y_I(t)+jy_Q(t)$. Thus, from the equation (7), the IQ mismatch model can be expressed by the following equation:

$$y(t)=A\cdot x(t)+B\cdot x^*(t) \quad (8)$$

where A and B are complex number with $$A = \frac{1}{2}\{(1+\alpha)e^{j\theta/2} + (1-\alpha)e^{-j\theta/2}\} \quad (9)$$

$$B = \frac{1}{2}\{(1+\alpha)e^{j\theta/2} - (1-\alpha)e^{-j\theta/2}\}$$

Eq. (8) is for the case of zero local leakage. When the local leakage $\gamma$ of the IQ mismatch is considered, the IQ mismatch model becomes $$y(t)=A\cdot(x(t)+\gamma)+B\cdot(x(t)+\gamma)^* \quad (10)$$

One of solutions to the I/Q imbalance compensation is pre-distortion of the baseband signal x(t) before the I/Q modulation. If the signal is pre-distorted properly, the signal after the I/Q modulation will be free from the I/Q imbalance since the I/Q imbalance and the pre-distortion cancel out. Assuming that the baseband signal x(t) is pre-distorted by a function D, the pre-distorted signal can be expressed as D(x(t)) The ideally calibrated output signal should be:

$$y(t) = A \cdot (D(x(t)) + \gamma) + B \cdot (D(x(t)) + \gamma)^* \quad (11a)$$

$$= C \cdot x(t) \quad (11b)$$

where C is a constant.

Accordingly, the I/Q imbalance compensation can be achieved by identifying the function D to satisfy the equation (11b). One of solutions for the function D is a function with parameters $A_p$ and $B_p$ and is given by:

$$D(x(t)) = A_p \cdot x(t) + B_p \cdot x^*(t) \quad (12)$$

The above is for the case of zero local leakage. When the local leakage of the IQ modulation is not zero, the function D becomes $$D(x(t)) = A_p \cdot x(t) + B_p \cdot x^*(t) - \gamma_p \quad (13)$$

By substituting the equation (13) into the equation (11a), we derive:

$$y(t) = (A \cdot A_p + B \cdot B_p^*) \cdot x(t) + \quad (14)$$
$$(A \cdot B_p + B \cdot A_p^*) \cdot x^*(t) + (\gamma - \gamma_p)A + (\gamma - \gamma_p)^*B$$

The equation (11b) is satisfied if $$\begin{cases} (A \cdot B_p + B \cdot A_p^*) = 0 \\ \gamma_p = \gamma \end{cases} \quad (15)$$

Therefore, the goal of the calibration method in the invention is identification of the coefficients $A_p$, $B_p$ and $\gamma_p$ in the equation (15).

In the present invention, a baseband test signal is generated. The test signal is a single-tone signal $e^{-j\omega_T t}$, where $\omega_T$ is a preset radian frequency. This test signal is generated by setting $x_I(t)=\cos(\omega_T t)$ and $x_Q(t)=-\sin(\omega_T t)$. Take $(A_p, B_p, \gamma_p) = (1,0,0)$ as an example, after the I/Q modulation, we derive an equivalent baseband signal y(t) of a modulated test signal given by:

$$y(t) = A \cdot (e^{-j\omega_T t} + \gamma) + B \cdot (e^{j\omega_T t} + \gamma^*) \quad (16)$$

By taking the square of the absolute value of the signal y(t), i.e., the square of the envelope of the modulated test signal, we derive a characteristic signal:

$$z(t) = G|y(t-\tau)|^2 \quad (17)$$
$$= 2 \cdot G(|A|^2 + |B|^2) \cdot \text{Re}\{\gamma \cdot e^{j\omega_T(t-\tau)}\} +$$
$$4 \cdot G \cdot \text{Re}\{A^* \cdot \gamma \cdot e^{-j\omega_T(t-\tau)}\} +$$
$$2 \cdot G \cdot \text{Re}\{A \cdot B^* \cdot \gamma \cdot e^{-j2\omega_T(t-\tau)}\} + (D.C. \text{ terms})$$

where $\tau$ is the loop delay of the signal path, G is the loop gain, and Re(x) denotes the real part of x. By sampling the characteristic signal z(t) (analog-to-digital conversion) and taking FFT (Fast Fourier Transform) of the sampled signal, we derive an FFT result $Z(\omega)$ which is a frequency response of z(t) at radian frequency $\omega$. Let $U(\omega)=Z(\omega)/N$, where N is the number of points of the FFT, the following frequency components are derived:

$$U(\omega) = \begin{cases} G \cdot (\gamma \cdot (|A|^2 + |B|^2) + 2 \cdot A^* \cdot B \cdot \gamma^*) \cdot e^{-j\omega_T \tau} L L \omega = \omega_T \\ G \cdot (\gamma^* \cdot (|A|^2 + |B|^2) + 2 \cdot A \cdot B^* \cdot \gamma) \cdot e^{j\omega_T \tau} L L \omega = -\omega_T \\ G \cdot A^* \cdot B \cdot e^{-j2\omega_T \tau} LLLLLLLLLLLL \omega = 2\omega_T \\ G \cdot A \cdot B^* \cdot e^{j2\omega_T \tau} LLLLLLLLLLLL \omega = -2\omega_T \end{cases} \quad (18)$$

Due to the loop delay $\tau$, the frequency response terms $U(\omega_T)$ and $U(2\omega_T)$ are rotated by the constant phases $-\omega_T \tau$ and $-2\omega_T \tau$, respectively. Therefore, a loop delay estimation is required. If the loop delay is compensated perfectly, the frequency response terms $U(2\omega_T)$ and $U(-2\omega_T)$ depend only on the I/Q imbalance coefficients A and B, and the frequency response terms $U(\omega_T)$ and $U(-\omega_T)$ depend on the I/Q imbalance coefficients A, B, and $\gamma$.

The calibration algorithm of the invention is based on the observation of the frequency response term $U(2\omega_T)$. A loop delay estimation is initially done and followed by iterative calibration steps. The initial values of the coefficients $A_p$ and $B_p$ are 1 and 0 respectively while that of the local leakage $\gamma_p$ is 0. The coefficients $A_p$ and $B_p$, and local leakage $\gamma_p$ are iteratively updated by using functions of current values of $U(\omega_T)$, $U(2\omega_T)$, $A_p$, $B_p$ and $\gamma_p$ to derive their new values. The iteration is terminated when a preset iteration number is reached. Thus, by selecting a proper iteration number, the coefficients $A_p$ and $B_p$, and local leakage $\gamma_p$ are accurate enough to derive the pre-distortion function D for the I/Q imbalance compensation.

Figure 2A:
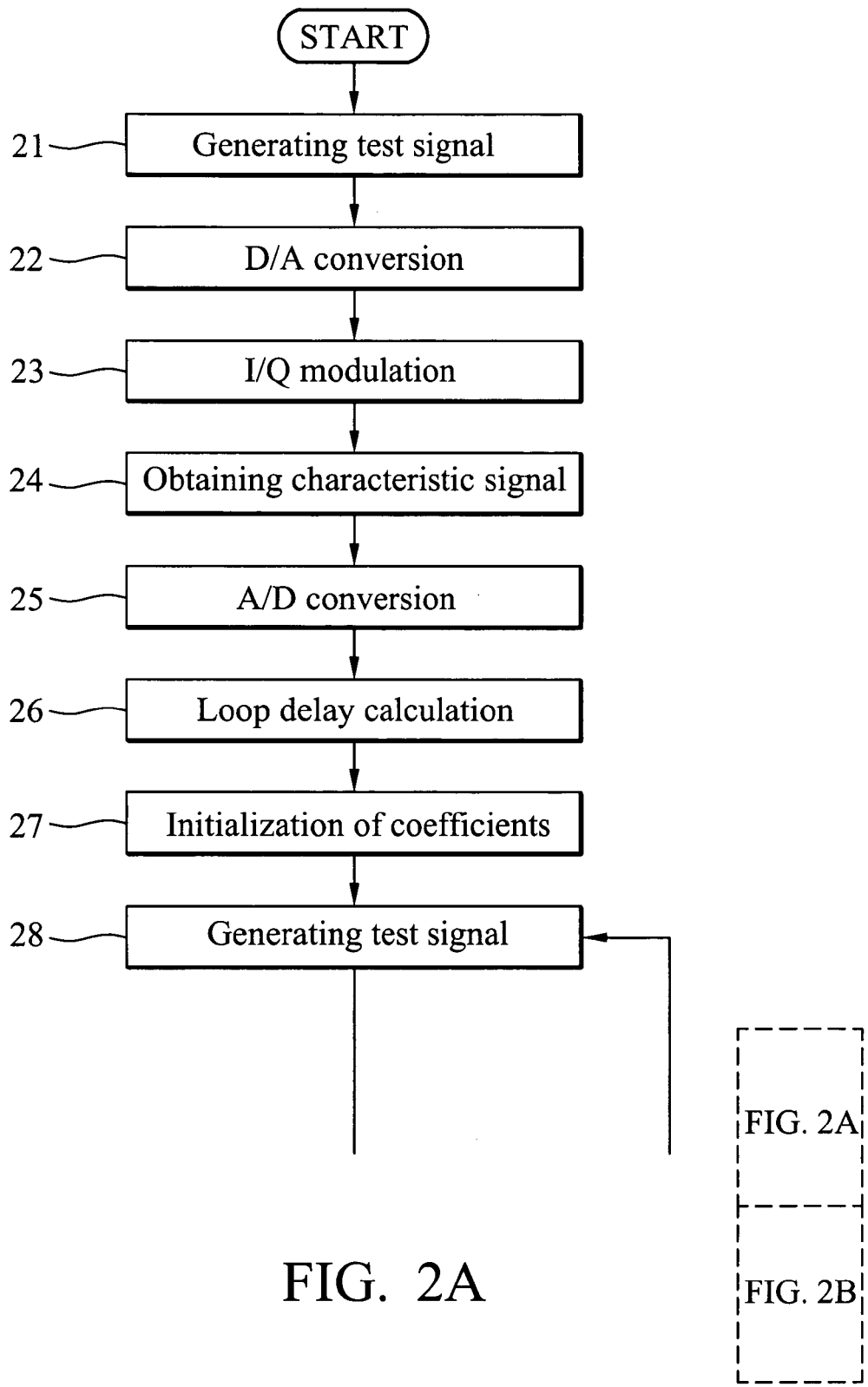
FIG. 2 is a flowchart of a method for I/Q imbalance calibration of an OFDM system according to one embodiment of the invention.
Figure 2B:
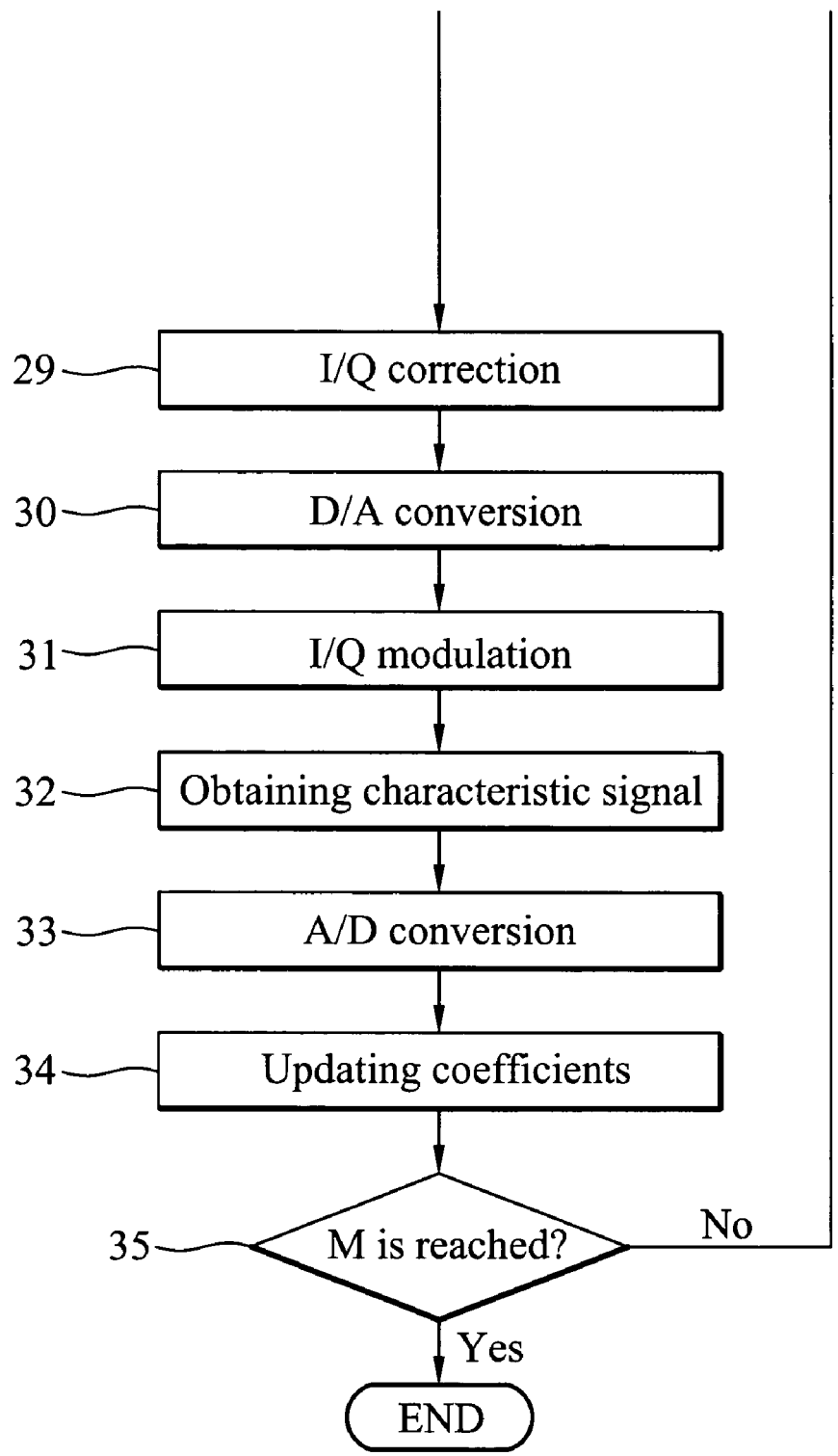

FIG. 2 is a flowchart of a method for I/Q imbalance calibration of an OFDM system according to one embodiment of the invention. The calibration procedure of the invention will be specifically described in the following.

In step 21, a discrete-time signal $x'[n]=\cos(\omega_T nT_s)+\gamma_T$ is generated, which is a test signal for loop delay estimation, where $\omega_T$ is a preset radian frequency, $T_s$ is a preset sampling interval, $\gamma_T$ is a constant substantially larger than $\gamma$. Usually, the actual value of $\gamma$ is much smaller than 1, and $\gamma_T$ is chosen as 1.

In step 22, the test signal x'[n] is converted to an analog signal x'(t).

In step 23, the analog signal x'(t) is transmitted through the I/Q modulator, which generates a modulated signal $X'_{mod}(t)$.

In step 24, a characteristic signal $x'_c(t)$ of the modulated signal $x'_{mod}(t)$ is obtained by taking the square of the envelope of the signal $x'_{mod}(t)$.

In step 25, a sampled characteristic signal $x'_s[n]$ is further obtained by sampling the characteristic signal $x'_c(t)$ (analog-to-digital conversion). A N-points FFT is applied to the signal $x'_s[n]$ to obtain a statistics V, wherein $V=U(\omega_T)$ is a value indicative of the frequency response of $x'_c(t)$ at radian frequency $\omega_T$.

In step 26, the loop delay factor $L=e^{-j\omega_T \tau}$ is estimated by the following equation:

$$L = \frac{V}{|V|} \quad (19)$$

After the loop delay factor L is derived, the coefficients $A_p$ and $B_p$ are derived by the following iterative steps.

In step 27, the coefficients $A_p$, $B_p$ and $\gamma_p$ are initialized. Their initial values are 1, 0 and 0 respectively.

In step 28, a discrete-time signal $x[n]=x(n\cdot T_s)$ is generated, wherein $x(t)=e^{j\omega_T t}$. $x[n]$ is a test signal for estimation of the coefficients $A_p$, $B_p$, and $\gamma_p$.

In step 29, a compensated signal $x_{com}[n]$ is generated by compensating the test signal $x[n]$ according to a function with parameters $A_p$, $B_p$ and $\gamma_p$. The function is:

$$x_{com}[n]=A_p\cdot x[n]+B_p\cdot x^*[n]-\gamma_p \quad (20)$$

In step 30, the compensated signal $x_{com}[n]$ is converted to an analog signal $x_{com}(t)$.

In step 31, the I/Q modulation is applied to the analog signal $x_{com}(t)$ to generate a modulated signal $x_{com(t)}$.

In step 32, a characteristic signal $x_c(t)$ of the modulated signal $x_{mod}(t)$ is obtained by taking the square of the envelope of the signal $x_{mod}(t)$.

In step 33, a sampled characteristic signal $x_s[n]$ is further obtained by sampling the characteristic signal $x_c(t)$ (analog-to-digital conversion). Statistics $U_1$ and $U_2$ are obtained by taking N-points FFT of the sampled characteristic signal $x_s[n]$. The statistics $U_1=U(\omega_T)$ and $U_2=U(2\omega_T)$ are values indicative of the frequency response of $x_c(t)$ at radian frequency $\omega_T$ and $2\omega_T$, respectively.

In step 34, the parameters $A_p$, $B_p$ and $\gamma_p$ are updated. The new $A_p$ and $B_p$ are computed based on the current $A_p$ and $B_p$, the loop delay factor L, and the statistic $U_2$. The new $\gamma_p$ is computed based on the current $\gamma_p$, the loop delay factor L, and the statistic $U_1$. The updated functions are:

$$A'_p=A_p-\mu\cdot B_p\cdot U^*_2\cdot L\cdot L$$
$$B'_p=B_p-\mu\cdot A_p\cdot U_2\cdot (L\cdot L)^* \quad (21)$$
$$\gamma'_p=\gamma_p+\mu\cdot U_1\cdot L^*$$

where $A'_p$, $B'_p$ and $\gamma'_p$ are the updated values, $A_p$, $B_p$ and $\gamma_p$ are the current values, and $\mu$ is a preset step size parameter. The step size parameter $\mu$ should be assigned carefully. The proper value of $\mu$ depends on the loop gain G. As an example, $\mu$ may be selected as $1/|G|^2$.

In step 35, it is determined whether a preset iteration number M is reached. If the coefficients $A_p$, $B_p$, and $\gamma_p$ are iteratively updated more than M times, the procedure is terminated; otherwise, the procedure goes to step 28 for another iteration.

It is obvious to these skilled in the art that the previously described method can be slightly modified without substantially difference. For example, the test signal used for loop delay estimation could also be $x'[n]=C\cdot\cos(\omega_T nT_s)+\gamma_T$, or $x'[n]=C\cdot\sin(\omega_T nT_s)+\gamma_T$, where C is a non-zero constant. The test signal used for estimation of the coefficients $A_p$, $B_p$, and $\gamma_p$, could also be $x[n]=C\cdot e^{-j\omega_T nT_s}$, or $x[n]=C\cdot e^{j\omega_T nT_s}$.

The previously described method can be applied to any transmitter involving I/Q modulation. e.g., an IEEE 802.11 compliant wireless LAN transceiver module. Wireless LANs based on the IEEE 802.11 standard have achieved wide customer acceptance in the enterprise environment. They are expected to continue to expand in popularity and become ubiquitous communication systems in private and public places. Prior to the circuit for I/Q imbalance calibration in the present invention, the basics of the IEEE 802.11 wireless LAN physical layer will be described first in the following.

Originally, the 802.11 standard was written for 1 Mb/s and 2 Mb/s data rates in the 2.4 GHz–2.5 GHz ISM band, possibly using direct sequence code division multiplexing in combination with DBPSK and DQPSK modulation, respectively. An eleven-chip long Barker sequence provides processing gain, which relaxes the SNR to below 0 dB. The channel bandwidth of 14 MHz placed anywhere in the band on a 5 MHz grid allows network configurations with 3–4 access points in close physical proximity. The maximum RF transmitting power is 30 dBm.

The 802.11b standard option enhances the wireless LAN data rate to a maximum of 11 Mb/s by Complementary Code Keying (CCK) modulation. While still using the same chip rate in order not to change the RF signal bandwidth, a much-reduced processing gain accommodates the higher data rate to the expense of approximately 10 dB higher SNR requirements. Practically, at 11 Mb/s CCK is equivalent in almost all respects to regular DQPSK.

Figure 3:
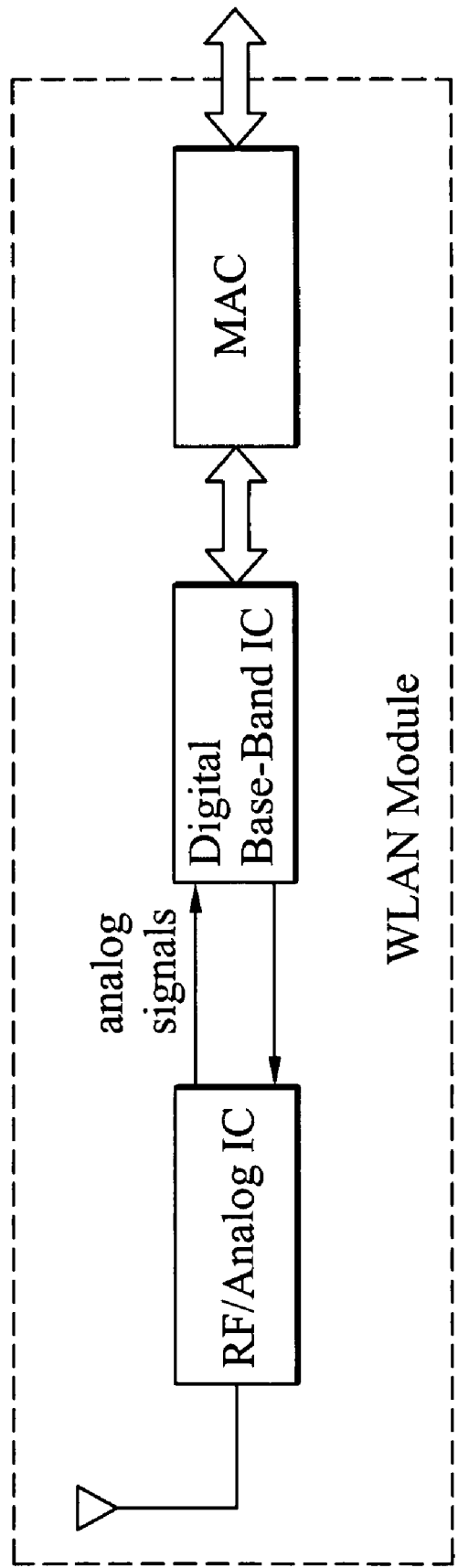
FIG. 3 shows a general architecture of an IEEE 802.11 compliant wireless LAN transceiver module.

The recent advances in RFIC and radio system technologies have provided ample opportunities for the realization of miniaturized and economically viable wireless LAN transceivers. Typically, these blocks are implemented as shown in FIG. 3 using a few ICs and several hundred passives (mostly by-pass capacitors), packaged tightly into small modules such as PCMCIA cards. Usually the cost of such modules is well within the consumer electronics market demands.

Focusing on the physical layer, notice that a radio chip and a base-band chip are typically used with analog I/Q transmit and receive interfaces. The base-band chip is mostly a digital circuit, containing only data converters as analog blocks. This system partitioning minimizes the digital switching noise coupling into the radio sections and provides low power chip-to-chip analog interfaces. The radio chip may be designed by different technologies such as Si bipolar, SiGe BiCMOS, or recently, even in straight CMOS. Typically, a –75 dBm sensitivity is accomplished for about 200 mW receiver power dissipation. The radio architecture has evolved from a conservative super-heterodyne approach to less expensive direct down/up conversion. The efficiency of the linear power amplifier is limited by the signal peak-to-average ratio, which is moderate, allowing reasonable transmitter power dissipation, typically 500 mW.

Using the standard, one can derive the basic transceiver specifications. The following approximate calculations are not intended to give precise design values but rather to indicate the rough figures for 802.11a radio systems.

The signal to noise-plus-distortion ratio (SNR) at the receiver A/D output is the primary overall design requirement. Starting with the –174 dBm/Hz background thermal noise and adding 73 dB corresponding to the 73 MHz channel bandwidth we obtain –101 dBm for the antenna noise. Subtracting this number from the required –65 dBm receiver sensitivity (minimum antenna signal), we calculate an input SNR of 36 dB. Since the standard assumes a 15 dB noise figure (NF) receiver, everything else being ideal, 21 dB SNR results at the output of the receiver A/D converter. This is a static channel calculation, assuming no fading and not taking into account the SNR loss in the base-band processing due to many error sources.

If fading is present, the previous calculation is amended by about a 5 dB "channel correction factor", as it can be simulated for a 54 Mb/s with 50 ns RMS delay spread. The required SNR at the output of the A/D converter jumps to approximately 26 dB. Furthermore, transmitter and receiver practical errors are usually responsible for at least 3–4 dB performance deterioration so a final 30 dB SNR is estimated. Referring this number back to the original SNR calculation and assuming the same –65 dBm sensitivity, we see that a practical receiver will have a NF less than 7 dB. Notice that the only ways the design methodology can make a difference in the transceiver performance are by minimizing the receiver NF and the various practical errors mentioned previously. For this reason it is instructive to identify these errors and the circuit blocks where they are produced.

The "transmitter implementation noise" is dependent on the signal level and it is caused by the transmitter non-idealities such as phase noise, limited power amplifier (PA) back-off, finite linearity of the transmit chain, and truncation error. The maximum transmitter implementation noise is given in the standard through the Error Vector Magnitude (EVM) specification. The "receiver thermal noise" is independent of the signal and is given by the NF. The "receiver implementation noise" is signal dependent and is produced by many non-idealities such as local oscillator noise, non-linearity in receiver chain, I/Q imbalances, DC offsets, A/D converter quantization noise, residual adjacent channels or blockers due to insufficient filtering, etc. We see that a large number of negative factors produce errors, which can easily add up to many SNR dB losses.

Figure 4:
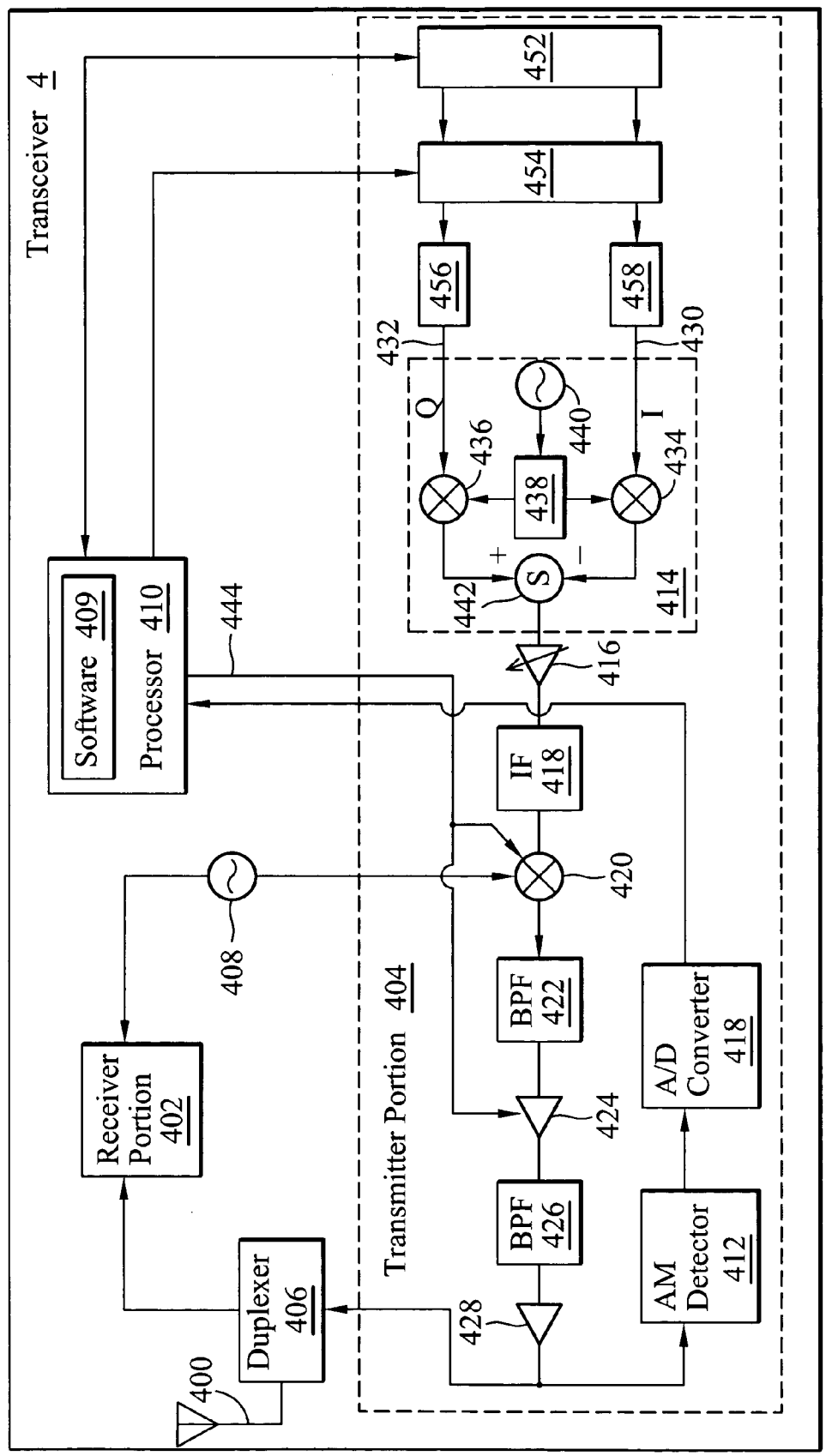
FIG. 4 shows a circuit for I/Q imbalance calibration used in an IEEE 802.11 compliant wireless LAN transceiver module according to one embodiment of the invention.

FIG. 4 shows the circuit for I/Q imbalance calibration used in the previously described IEEE 802.11 compliant wireless LAN transceiver module according to one embodiment of the invention.

The transceiver 4 includes a receiver portion 402, transmitter portion 404, duplexer 406, a first frequency source 408 and processor 410 having software 409. The receiver portion 402 and transmitter portion 404 are both electrically connected to the duplexer 406. The duplexer 406 allows reception and transmission over antenna 400 by both the receiver portion 402 and transmitter portion 404. The first frequency source 408 is electrically connected to both the receiver portion 402 and transmitter portion 404. The first frequency source 408 is a standard frequency device such a local oscillator, frequency synthesizer, or other similar frequency device.

The transmitter portion 404 may utilize a super-heterodyne or a direct-conversion transmitter. Take super-heterodyne one as an example, a baseband signal is first modulated up to an intermediate UHF frequency, and then the intermediate frequency signal is modulated up to the desired VHF transmit frequency. The transmitter portion 404 may include a digital baseband circuitry composed of an baseband transmitter 452, I/Q correction module 454 and D/A converters 456 and 458, I/Q modulator 414, automatic gain control (AGC) amplifier 416, intermediate frequency (IF) filter 418, mixer 420, image reject bandpass filter (BPF) 422, pre-driver amplifier 424, BPF 426 and power amplifier 428.

The I/Q modulator 414 is electrically connected to AGC amplifier 416. The AGC amplifier 416 is electrically connected to the IF filter 418. The IF filter 418 is electrically connected to the mixer 420. The mixer 420 is electrically connected to both the first frequency source 408 and image reject BPF filter 422. The image reject BPF filter 422 is electrically connected to the pre-driver amplifier 424. The pre-driver amplifier 424 is electrically connected to the BPF filter 426. The BPF filter 426 is electrically connected to the power amplifier 428. The power amplifier 428 is electrically connected to the duplexer 406.

The baseband transmitter 452 originates a digital complex baseband signal having in-phase (i.e., I channel) and out-of-phase (i.e., quadrature "Q" channel) components.

The I/Q correction module 454 receives the I and Q baseband signals. The coefficients $A_p$, $B_p$ and $\gamma_p$ for the I/Q imbalance compensation are also derived by the I/Q correction module 454 from the processor 410. The I and Q baseband signals output from the I/Q correction module are free from the I/Q imbalance. The D/A converters 456 and 458 convert the digital baseband signal to an analog signal.

The baseband circuitry is followed by the I/Q modulator 414 that modulates the analog baseband signal to a VHF intermediate frequency utilizing an in-phase mixer 434, out-of-phase mixer 436, 90° phase shifter 438, second frequency source 440 and combiner 442. The I/Q modulator 414 is followed by the AGC amplifier 416 that provides a variable linear power output.

The IF filter 418 follows the AGC amplifier 416. The IF filter 418 reduces the out-of-band noise (especially the receiver band noise "RX band noise" and spurious signals. The IF filter 418 is followed by the mixer 420 that modulates the IF signal up to the desired transmit frequency (i.e., a second frequency band), such as ultra high frequency "UHF" or radio frequency "RF" utilizing the first frequency source 408. The output from the mixer 420 is processed by the image reject BPF 422. The BPF 422 rejects the image frequency (such as higher order harmonics) from the signal output from the mixer 420, and passes or substantially passes the entire range of transmit frequencies. At the same time, the BPF 422 attenuates the RX band noise generated by the mixer 420. It is appreciated that a BPF 422 is not necessary in certain architectures where an image reject mixer configuration is utilized.

The pre-driver amplifier 424 follows the image reject BPF 422. The pre-driver amplifier 424 boosts the level of the transmit signal from the image reject BPF 422 to a level high enough to drive the power amplifier 428. The BPF 426 follows the pre-driver amplifier 424. The BPF 426 passes the entire range or substantially the entire range of transmit frequencies, but attenuates harmonic frequencies generated by the pre-driver amplifier 424. The BPF 426 is configured to have low loss at transmit frequencies, but high attenuation at harmonic frequencies and at frequencies in the receiver band. As an example, the BPF 426 may be a ceramic or surface acoustic wave "SAW" filter. The power amplifier 428 follows the BPF 426. The power amplifier 428 boosts the level of the transmit signal to the desired output power and sends the signal to the antenna 400 via the duplexer 406.

Further, the processor 410 also determines the coefficients $A_p$, $B_p$ and $\gamma_p$ for the I/Q correction module 454 by the software 409 in corporation with the AM detector 412, A/D converter 418 and baseband transmitter 452. By executing the software 409, the processor 410 conducts a procedure for adaptation of the coefficients $A_p$, $B_p$ and $\gamma_p$, which is described in the following.

First, a loop delay estimation phase is initiated. A discrete-time signal $x'[n]=\cos(\omega_T nT_S)+\gamma_T$, is generated by the baseband transmitter 452, which is a test signal for loop delay estimation and $\omega_T$ is a preset radian frequency, $T_s$ is the sampling interval and $\gamma_T$ is a predetermined real number. The coefficients $A_p$, $B_p$ and $\gamma_p$ are set as 1, 0 and 0 by the processor 410 so that the I/Q correction module 454 acts as a unit gain buffer. The I and Q signals of the test signal $x'[n]$ are converted to analog signals by the A/D converters 456 and 458 respectively, wherein the combined signal can be expressed as $x'(t)$. The analog signal $x'(t)$ is transmitted through the I/Q modulator 414, which generates a modulated signal $x'_{mod}(t)$. After the modulated signal $x'_{mod}(t)$ is transferred through the AGC amplifier 416, IF filter 418, mixer 420, band-pass filter 422, pre-driver 424, band-pass filter 426 and power amplifier 428, the output signal from the power amplifier 428 is fed back to the AM detector 412. The AM detector 412 takes the square of the envelope of the fed-back signal, to obtain a characteristic signal $x'_c(t)$. It is noted that the characteristic signal $x'_c(t)$ just equals to the square of the envelope of the modulated signal $x'_{mod}(t)$. The characteristic signal $x'_c(t)$ is then sampled by the A/D converter 418 which outputs a sampled characteristic signal $x'_s[n]$. The sampled characteristic signal $x'_s[n]$ is sent to the processor 410 applying a N-points FFT to the signal $x'_s[n]$. Thus, a statistics V is obtained in the FFT result by the processor 410, which is a value indicative of the frequency response of $x'_c(t)$ at radian frequency $\omega_T$. The processor 410 estimates the loop delay factor L by the previously described equation (19).

After the loop delay factor L is derived, the processor 410 initiates a calibration phase for determination of the coefficients $A_p$, $B_p$ and $\gamma_p$. The coefficients $A_p$, $B_p$ and $\gamma_p$ are initially set as 1, 0, and 0 by the processor 410. Another discrete-time signal $x[n]=e^{j\omega_T nT_s}$ is generated by the baseband transmitter, which is a test signal for estimation of the coefficients $A_p$ $B_p$, and $\gamma_p$. The I/Q correction module 454 compensates the signal $x[n]$ according to the previously described equation (20) and outputs a compensated signal $x_{com}[n]$. It is noted that, in the first round, the I/Q correction module 454 acting as a unit gain buffer outputs a compensated signal the same as the signal $x[n]$ while the compensated signal $x_{com}[n]$ will be different from the signal $x[n]$ in the later rounds due to new coefficients $A_p$, $B_p$ and $\gamma_p$.

The compensated signal $x_{com}[n]$ is converted to an analog signal $x_{com}(t)$ by the D/A converters 456 and 458 respectively on the I and Q channel. The analog signal $x_{com}(t)$ is transmitted through the I/Q modulator 414, which generates a modulated signal $x_{mod}(t)$. After the modulated signal $x_{mod}(t)$ is transferred through the AGC amplifier 416, IF filter 418, mixer 420, band-pass filter 422, pre-driver 424, band-pass filter 426 and power amplifier 428, the output signal from the power amplifier 428 is fed back to the AM detector 412. The AM detector 412 takes the square of the envelope of the fed-back signal to obtain a characteristic signal $x_c(t)$. It is noted that the characteristic signal $x_c(t)$ just equals to the square of the envelope of the modulated signal $x_{mod}(t)$ The characteristic signal $x_c(t)$ is then sampled by the A/D converter 418 which outputs a sampled characteristic signal $x_s[n]$. The sampled characteristic signal $x_s[n]$ is sent to the processor 410 applying a N-points FFT to the signal $x_s[n]$. Thus, statistics $U_1$ and $U_2$ are obtained in the FFT result by the processor 410, which are values indicative of the frequency response of $x_c(t)$ at radian frequency $\omega_T$ and $2\omega_T$, respectively. The processor updates the coefficients $A_p$, $B_p$ and $\gamma_p$. The new $A_p$ and $B_p$ are computed based on the current $A_p$ and $B_p$, the loop delay factor L, and the statistic $U_2$ while the new $\gamma_p$ is computing based on the current $\gamma_p$, the loop delay factor L, and the statistic $U_1$. The updating functions have been shown in the equation (21). After updating the coefficients, the processor 410 determines whether a preset iteration number M is reached. If the coefficients $A_p$ and $B_p$ and $\gamma_p$ are iteratively updated more than M times, the processor 410 terminates the procedure.

Thus, after the calibration procedure, the I/Q correction module 454 compensates the I/Q imbalance in the signal from the baseband transmitter 452 by the finally determined coefficients $A_p$, $B_p$ and $\gamma_p$. The previously described calibration procedure may be implemented upon start-up of the transceiver.

In conclusion, the present invention provides a new method and apparatus for transmitter I/Q imbalance calibration, especially suitable for an IEEE 802.11 compliant WLAN transceiver module. The compensation of the I/Q imbalance is achieved by a signal distortion prior to the I/Q modulation. The coefficients of the pre-distortion function are determined by an iterative algorithm. After a properly selected number of iterations, the coefficients are accurate enough for the transmitted signal to be free from the I/Q imbalance.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for I/Q imbalance calibration of a transmitter, comprising the steps of:

initializing parameters $A_p$, $B_p$ and $\gamma_p$;

estimating a loop delay factor L;

generating a test signal $x[n]=x(n \cdot T_S)$, wherein $x(t)=e^{j\omega_T t}$ and $\omega_T$ is a preset radian frequency and $T_S$ is sampling interval;

generating a compensated signal $x_{com}[n]$ by compensating the test signal $x[n]$ according to a first function with parameters $A_p$, $B_p$ and $\gamma_p$;

converting the compensated signal $x_{com}[n]$ to an analog signal $x_{com}(t)$;

applying I/Q modulation to the analog signal $x_{com}(t)$ and outputting a modulated signal $x_{mod}(t)$;

obtaining a characteristic signal $x_c(t)$ of the modulated signal $x_{mod}(t)$;

obtaining a sampled characteristic signal $x_S[n]$ by sampling the characteristic signal $x_c(t)$ and obtaining statistics $U_1$ and $U_2$ of the sampled characteristic signal $x_S[n]$, where $U_1$ and $U_2$ are values indicative of the frequency response of $x_c(t)$ at radian frequency $\omega_T$ and $2\omega_T$, respectively; and updating the parameters $A_p$, $B_p$ and $\gamma_p$ respectively by one of the second functions, the loop delay factor L, the statistics $U_1$ and $U_2$, and the current values of the parameters $A_p$, $B_p$ and $\gamma_p$.

2. The method as claimed in claim 1, wherein the step of estimating the loop delay factor further comprises the steps of:

generating a test signal $x'[n]=\cos(\omega_T nT_S)+\gamma_T$ which is a discrete-time signal and $\gamma_T$ is a predetermined number;

converting the test signal $x'[n]$ to an analog signal $x'(t)$;

applying I/Q modulation to the analog signal $x'(t)$ and outputting a modulated signal $x'_{mod}(t)$;

obtaining a characteristic signal $x'_c(t)$ of the modulated signal $x'_{mod}(t)$;

obtaining a sampled characteristic signal $x'_S[n]$ by sampling the characteristic signal $x'_c(t)$ and obtaining a statistics v of the sampled characteristic signal $x'_S[n]$, where V is a value indicative of the frequency response of $x'_c(t)$ at radian frequency $\omega_T$; and estimating the loop delay factor L based on the statistics V.

3. The method as claimed in claim 2, wherein the statistics V is obtained by taking FFT of the sampled characteristic signal $x'_S[n]$.

4. The method as claimed in claim 3, wherein the estimated loop delay factor L is $V/|V|$.

5. The method as claimed in claim 2, wherein the characteristic signal is derived by taking the square of an envelope of the modulated signal.

6. The method as claimed in claim 1, wherein the first function is $x_{com}[n]=A_p \cdot x[n]+B_p \cdot x^*[n]-\gamma_p$.

7. The method as claimed in claim 1, wherein the statistics $U_1$ and $U_2$ are obtained by taking FFT of the sampled characteristic signal $x_S[n]$.

8. The method as claimed in claim 1, wherein the parameters $A_p$, $B_p$ and $\gamma_p$ are updated by the steps of:
computing the updated $A_p$ based on the current $A_p$ and $B_p$, the loop delay factor L, and the statistic $U_2$;
computing the updated $B_p$ based on the current $A_p$ and $B_p$, the loop delay factor L, and the statistic $U_2$; and
computing the updated $\gamma_p$ based on the current $\gamma_p$, the loop delay factor L, and the statistic $U_1$.

9. The method as claimed in claim 1, wherein the second functions for updating the parameters $A_p$, $B_p$ and $\gamma_p$ are:

$$A'_p = A_p - \mu \cdot B_p \cdot U^*_2 \cdot L \cdot L;$$

$$B'_p = B_p - \mu \cdot A_p \cdot U_2 \cdot (L \cdot L)^*; \text{ and}$$

$$\gamma'_p = \gamma_p + \mu \cdot U_1 \cdot L^*;$$

where $A'_p$, $B'_p$ and $\gamma'_p$ are the updated values, $A_p$, $B_p$ and $\gamma_p$ are the current values, and $\mu$ is a preset step size parameter.

10. The method as claimed in claim 1, wherein the characteristic signal is derived by taking the square of an envelope of the modulated signal.

11. An apparatus for I/Q imbalance calibration in a transmitter comprising:
a discrete-time signal generator generating a first test signal $x_1[n]=\cos(\omega_T n T_S)+\gamma_T$, where $\omega_T$ is a preset radian frequency, $T_S$ is a predetermined sampling interval, and $\gamma_T$ is a predetermined number, in an estimation phase, and generating a second test signal $x_2[n]=e^{j\omega_T n T_S}$ in a calibration phase which follows the estimation phase;
a correction module receiving the test signal from the signal generator, compensating the test signal according to a first function with parameters $A_p$, $B_p$ and $\gamma_p$ to produce a compensated signal;
a first and second D/A converter converting the compensated signal to an analog signal, wherein the first D/A converter converts the real part of the compensated signal to the real part of the analog signal, and the second D/A converter converts the imaginary part of the compensated signal to the imaginary part of the analog signal;
a modulator applying I/Q modulation to the analog signal, and outputting a modulated signal;
a detector obtaining a characteristic signal of the modulated signal;
an A/D converter converting the characteristic signal to a sampled characteristic signal; and
a processor implementing the steps of:
initializing the parameters $A_p$, $B_p$ and $\gamma_p$;
obtaining a statistic V based on the sampled characteristic signal in the estimation phase, where V is a value indicative of the frequency response of $x'_c(t)$ at radian frequency $\omega_T$;
estimating a loop delay factor L based on the statistic V in the estimation phase;
obtaining statistics $U_1$ and $U_2$ based on the sampled characteristic signal in the calibration phase, where $U_1$ and $U_2$ are values indicative of the frequency response of $x_c(t)$ at radian frequency $\omega_T$ and $2\omega_T$, respectively; and
updating the parameters $A_p$, $B_p$ and $\gamma_p$ based on the loop delay factor L, the statistics $U_1$ and $U_2$, and the current values of the parameters $A_p$, $B_p$ and $\gamma_p$ in the calibration phase.

12. The apparatus as claimed in claim 11, wherein the statistics V are obtained by taking FFT of the sampled characteristic signal in the estimation phase.

13. The apparatus as claimed in claim 11, wherein the loop delay factor L is $V/|V|$.

14. The apparatus as claimed in claim 11, wherein the first function is $x_{com}[n]=A_p \cdot x[n]+B_p \cdot x^*[n]-\gamma_p$, where $x[n]$ and $x_{com}[n]$ denote the test signal and the compensated signal, respectively, and $x[n]=x_1[n]$ in the estimation phase, $x[n]=x_2[n]$ in the calibration phase.

15. The apparatus as claimed in claim 11, wherein the statistics $U_1$ and $U_2$ are obtained by taking FFT of the sampled characteristic signal in the calibration phase.

16. The apparatus as claimed in claim 11, wherein the processor updates the parameters $A_p$, $B_p$ and $\gamma_p$ by the steps of:
computing the updated $A_p$ based on the current $A_p$ and $B_p$, the loop delay factor L, and the statistic $U_2$;
computing the updated $B_p$ based on the current $A_p$ and $B_p$, the loop delay factor L, and the statistic $U_2$; and
computing the updated $\gamma_p$ based on the current $\gamma_p$, the loop delay factor L, and the statistic $U_1$.

17. The apparatus as claimed in claim 16, wherein the processor updates the parameters $A_p$, $B_p$ and $\gamma_p$ by the equations:

$$A'_p = A_p - \mu \cdot B_p \cdot U^*_2 \cdot L \cdot L;$$

$$B'_p = B_p - \mu \cdot A_p \cdot U_2 \cdot (L \cdot L)^*; \text{ and}$$

$$\gamma'_p = \gamma_p + \mu \cdot U_1 \cdot L^*$$

where $A'_p$, $B'_p$ and $\gamma'_p$ are the updated values, $A_p$, $B_p$ and $\gamma_p$ are the current values, and $\mu$ is a preset step size parameter.

18. The apparatus as claimed in claim 11, wherein the characteristic signal is derived by taking the square of an envelope of the modulated signal.

* * * * *